United States Patent
Cheng

[19]

[11] Patent Number: 5,976,981
[45] Date of Patent: Nov. 2, 1999

[54] METHOD FOR MANUFACTURING A REVERSE CROWN CAPACITOR FOR DRAM MEMORY CELL

[75] Inventor: Chih-Hsiung Cheng, Hsinchu, Taiwan

[73] Assignee: Vanguard International Semiconductor Corporation, Hsinchu, Taiwan

[21] Appl. No.: 09/096,677

[22] Filed: Jun. 12, 1998

[51] Int. Cl.[6] .................................................. H01L 21/302
[52] U.S. Cl. ......................... 438/691; 438/694; 438/706; 438/720; 257/306
[58] Field of Search .................................... 438/691, 694, 438/706, 697, 699, 720, 253, 254, 255, 256; 257/306

[56] References Cited

U.S. PATENT DOCUMENTS

| | | | |
|---|---|---|---|
| 5,652,165 | 7/1997 | Lu et al. ...................................... | 437/52 |
| 5,688,713 | 11/1997 | Linliu et al. .............................. | 438/253 |
| 5,700,731 | 12/1997 | Lin et al. .................................. | 438/381 |
| 5,879,985 | 3/1999 | Gambino et al. ........................ | 438/253 |
| 5,895,250 | 4/1999 | Wu ........................................... | 438/397 |

*Primary Examiner*—Benjamin Utech
*Assistant Examiner*—Kin-Chan Chen
*Attorney, Agent, or Firm*—Christensen, O'Connor, Johnson & Kindness PLLC

[57] ABSTRACT

The present invention is a method to manufacture a reverse crown capacitor. The method includes forming a triple layer silicon oxide/silicon nitride/silicon oxide over a substrate. A first node contact is defined in the triple layer. Spacers of a first node contact are formed. Then, a contact hole in the first node contact is formed to connect to the substrate. A polysilicon layer is deposited to from the plug of the contact hole. A chemical mechanical polishing (CMP) process is performed to remove the silicon nitride layer. Afterwards, a silicon oxide is formed over the substrate. A second node contact is defined and a polysilicon layer is formed on the second node contact to form the bottom plate of a capacitor. Finally, a dielectric film is formed over the bottom plate and a top plate is formed over the dielectric film.

20 Claims, 6 Drawing Sheets

5,976,981

METHOD FOR MANUFACTURING A REVERSE CROWN CAPACITOR FOR DRAM MEMORY CELL

FIELD OF THE INVENTION

The present invention relates to a method of manufacturing dynamic random access memory (DRAM), and more specifically, to a method of manufacturing a reverse crown capacitor for DRAM memory.

BACKGROUND OF THE INVENTION

It has been the trend to scale down the sizes of memory cells to increase the integration level and thus memory capacity of a DRAM chip. As the size of DRAMs is decreased, the capacity of the capacitor used in the DRAM is correspondingly decreased.

A memory cell of DRAM typically consists of a storage capacitor and an access transistor. One terminal of the capacitor is connected to the drain of the transistor. The source and the gate of the access transistor are connected to external connection lines, which are referred to as "bit line" and "word line". The other terminal of the capacitor is connected to a reference voltage. Thus, the formation of a DRAM cell comprises the formation of a transistor, the formation of a capacitor, the formation of the contact to the capacitor, and the formation of the connection lines.

The capacitor type is typically a planar capacitor, which is easy to manufacture. With the advent of ultra large scale integrated (ULSI) DRAM devices, the size of the devices have gotten smaller and smaller such that the available area for a single memory cell has become very small. This causes a reduction in the capacitor's area, resulting in the reduction of the cell's capacitance.

For very small memory cells, the planar capacitor is difficult to use reliably. Specifically, as the size of the capacitor decreases, the capacitance of the capacitor also decreases. This results in the capacitor being very susceptible to alpha-particle radiation. Additionally, as the capacitance decreases, the charge held by the storage capacitor must be refreshed often. A simple stacked capacitor can not provide sufficient capacitance, even with the use of special dielectric films as the capacitor insulator.

In the prior art, some methods have tried to solve the above problems. For example, trench-shape capacitors are used to increase the capacitor's area. Reducing the thickness of the capacitor's dielectric film can increase the capacitance of the capacitor, but this approach is limited because of yield and reliability problems.

In recent years, capacitors using hemispherical-grain (HSG) polysilicon and reverse-crown structures have been used. The HSG polysilicon increases the surface area of the capacitor's bottom plate, and therefore the capacitance is increased. Increasing the height of stack cells can increase the capacitance of stack capacitor. However, because the height of the stack cells is higher than peripheral circuits, this causes difficulties for cell planarization and the metal connection to the integrated circuit.

When the dimension of DRAM is close to deep-submicron, a new method for manufacturing small capacitors is needed. The planar size of the crown capacitance is too large for deep-submicron DRAM. The capacitor with hemispherical grain polysilicon can reduce the spacing between capacitor's plates. Further, the use of HSG polysilicon produces electrical leakage between the capacitor's plates. Thus, a method to fabricate a capacitor with HSG polysilicon is needed that solves the leakage problem.

SUMMARY OF THE INVENTION

A method for manufacturing a reverse crown capacitor on a substrate is disclosed. The method comprises the steps of: forming a first dielectric layer onto said substrate; forming an etching stop layer onto said first dielectric layer; forming a second dielectric layer onto said etching stop layer; patterning and etching said second dielectric layer, said etching stop layer and said first dielectric layer to form a first node contact; forming a first conducting layer onto said second dielectric layer and into said first node contact; etching back said first conducting layer to remove said first conducting layer and said second dielectric layer outside of said first node contact, further removing said first conducting layer at the bottom of said first node contact; removing said second dielectric layer and said first dielectric layer under said first node contact using said first conducting layer as a hard mask to form a contact hole; forming a second conducting layer to refill the contact hole and to cover said first conducting layer and said etching stop layer; removing said etching stop layer and an upper portion of said first conducting layer and an upper portion of said second conducting layer; forming a third dielectric layer onto said first dielectric layer, said first conducting layer, and said second conducting layer; patterning and etching said third dielectric layer and said first dielectric layer to form a second node contact; forming a third conducting layer into said second node contact and top said third dielectric layer; removing said third conducting layer outside of said second node contact; forming a dielectric film onto said third conducting layer; and forming a top plate onto said dielectric film.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
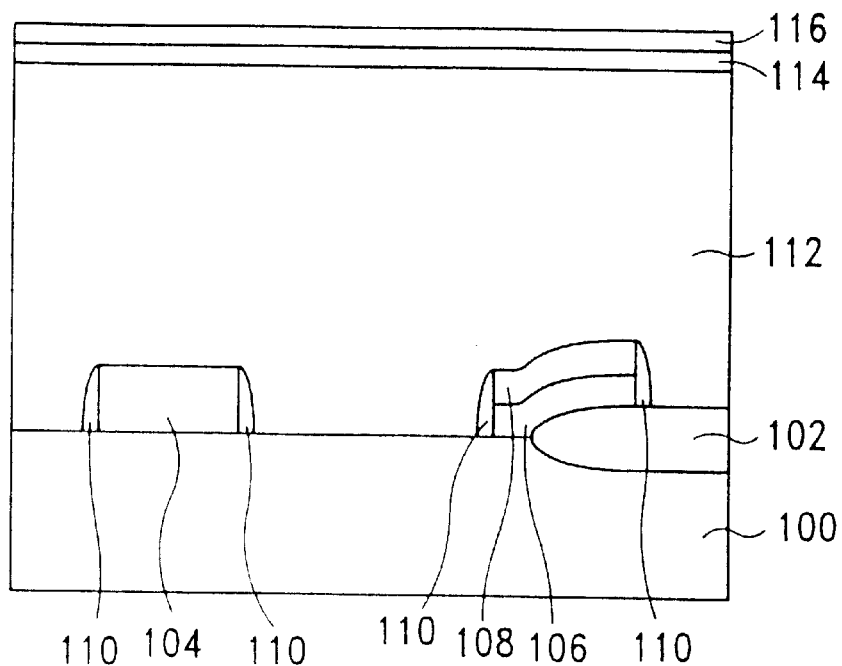
FIGS. 1–12 shows a cross sectional view of a semiconductor substrate showing the steps of forming a capacitor in accordance with the present invention.

Referring to FIG. 1, a single crystal P-type substrate 100 with a <100> crystallographic orientation is used for the preferred embodiment. A thick field oxide region (FOX) 102 is created using conventional methods for the purposes of isolation. Generally speaking, the FOX 102 region is created via photolithography and dry etching steps to etch a silicon nitride/silicon dioxide composite layer. After the photoresist is removed and wet cleaned, a thermal oxidation in an oxygen-steam ambient is used to form the FOX 102 region, to a thickness of about 3000 to 8000 angstroms.

Initially, a gate 104 is created atop the substrate 100 to use as the gate of the access transistor of the DRAM cell. The gate 104 includes a gate oxide and a gate electrode. In the preferred embodiment, using an oxygen-steam ambient forms the gate oxide. Alternatively, the gate oxide may be formed using other known oxide chemical composition and procedures. In the preferred embodiment, the thickness of the gate oxide layer is approximately 30 to 200 angstroms. The gate electrode is consequently formed from polysilicon material. As is known in the art, the polysilicon can be formed by using low pressure chemical vapor deposition (LPCVD), using silane as a source. The thickness of the polysilicon is approximately 1000 to 5000 angstroms. Finally, an interconnect layer 106, an insulating layer 108 and spacers 110 are formed using conventional techniques. Thus, only cursory description of the formation of gate structure is given here.

Still referring to FIG. 1, a silicon oxide layer 112 is deposited onto the substrate 100 using conventional techniques, for example, low pressure chemical vapor deposition (LPCVD). The thickness of the silicon oxide layer 112 is approximately 1000 to 5000 angstroms. A silicon nitride layer 114 is formed onto the silicon oxide layer 112 by using conventional techniques. In the preferred embodiment, the silicon nitride layer 114 is deposited by low pressure chemical vapor deposition, using $SiH_2Cl_2$ and $NH_3$ as the source of deposition, at a temperature of between about 700 to 800° C., at a pressure of between about 0.1 to 1 torrs. The thickness of the silicon nitride layer 114 is between about 50 to 500 angstroms. The silicon nitride layer 114 is formed for use as an etching stop layer. Then, a silicon oxide layer 116 is deposited on the silicon nitride layer 114 and is formed by using LPCVD.

Figure 2:
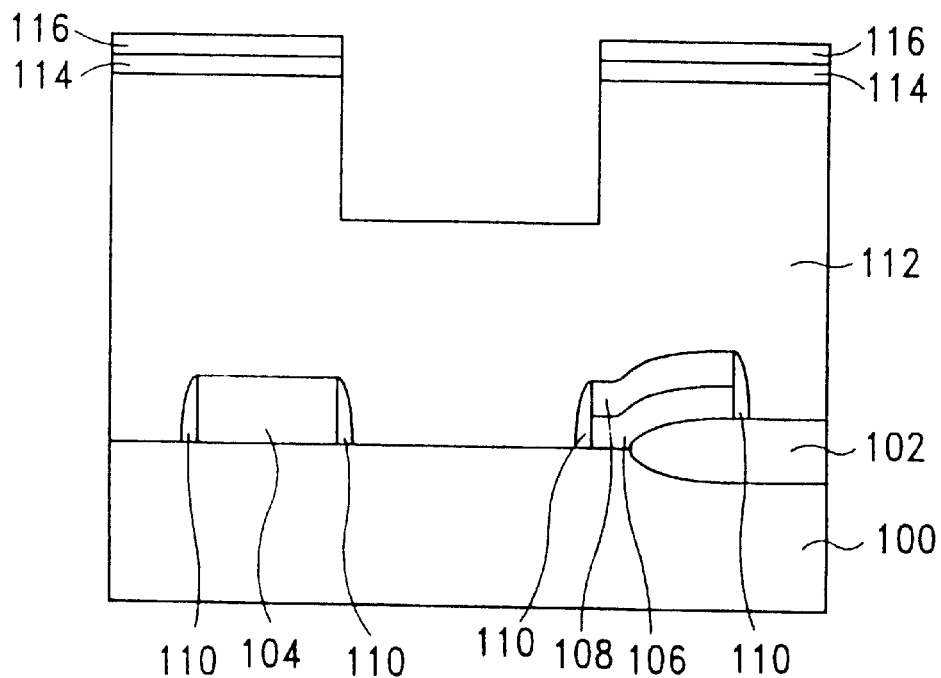

Referring to FIG. 2, a node contact hole is defined by using conventional lithography and etching process. The silicon oxide layer 112, 116 and the silicon nitride layer 114 are etched back to form the contact hole. The etching process of the contact hole uses a dry anisotropic etching.

Figure 3:
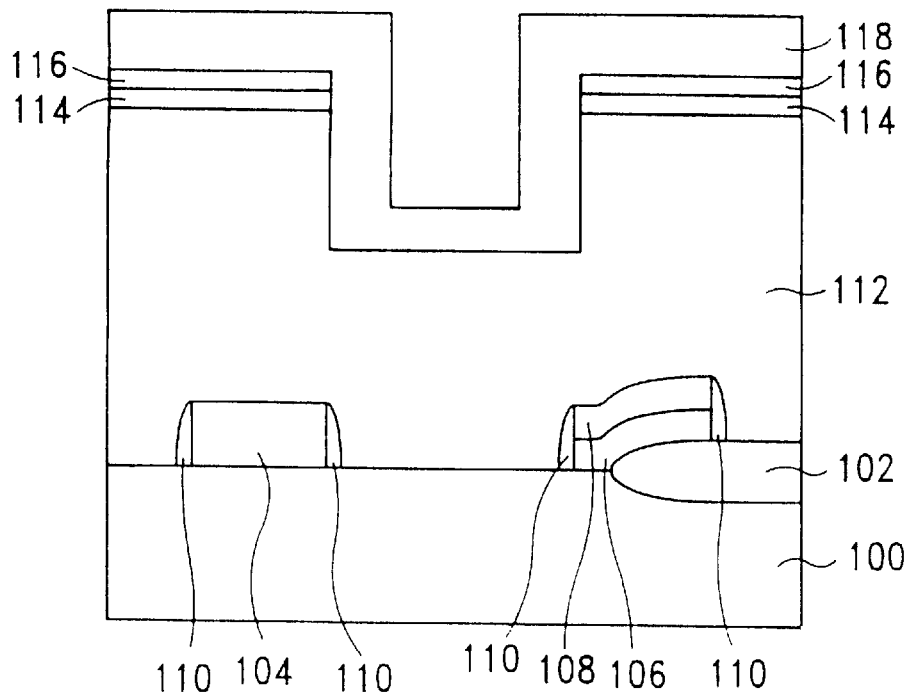

As shown in FIG. 3, a polysilicon layer 118 is deposited to form an inner capacitor region. In the preferred embodiment, the polysilicon layer 118 is deposited by conventional chemical vapor deposition. The polysilicon layer 118 has a thickness of between about 500 to 1500 angstroms. The area of the contact hole (also referred herein as the first node contact) in the silicon oxide 112 is reduced by the polysilicon layer 118.

Figure 4:
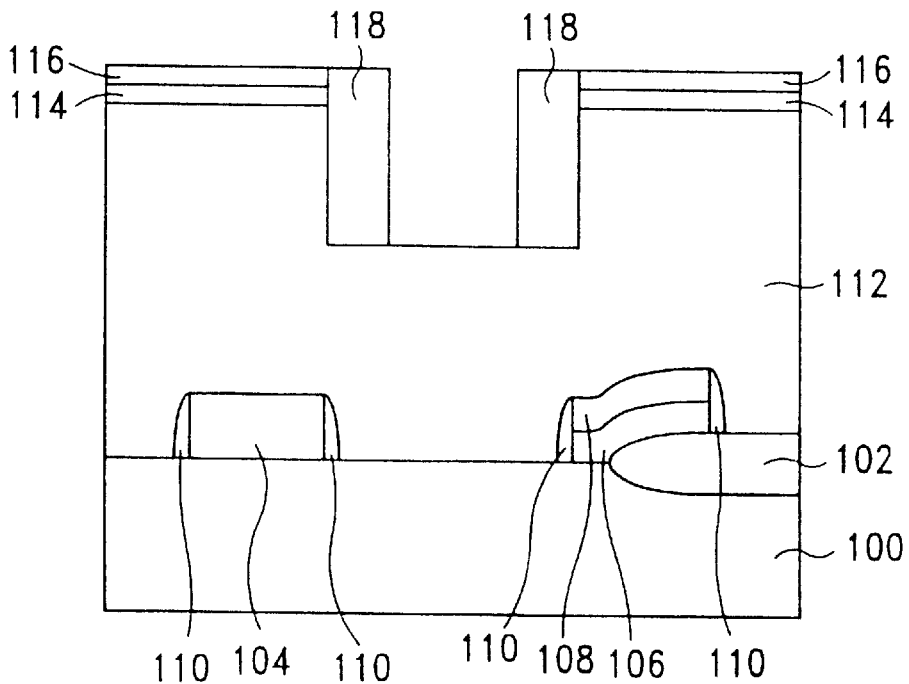

Turning next to FIG. 4, the polysilicon layer 118 is etched back to remove the polysilicon layer 118 on the silicon oxide layer 116. The polysilicon layer 118 remains only on the sidewalls of the first node contact. The polysilicon layer 118 is etched preferably by using anisotropic dry etching, as reactive ion etching (RIE), magnetic resonance reactive ion etching (MERIE) or electron cyclotron resonance (ECR) plasma etching.

Figure 5:
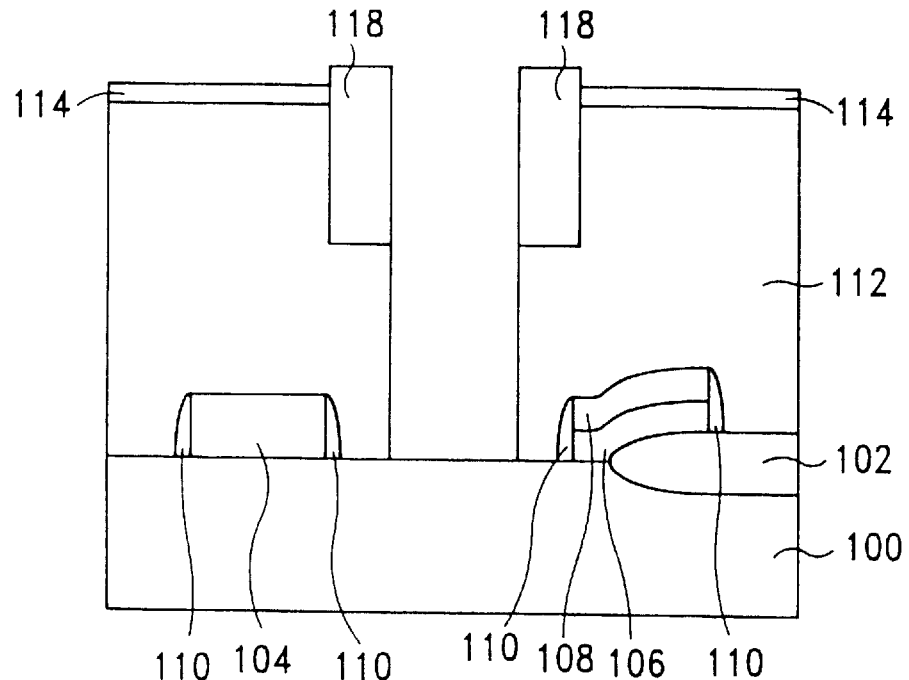

Referring to FIG. 5, a dry etching is performed to etch the silicon oxide layer 116 and the silicon oxide layer 112 which is below the first node contact (using the polysilicon layer 118 as a hard mask). The etching of the silicon oxide layer 116 is stopped on the silicon nitride layer 114 and the silicon substrate 100.

Figure 6:
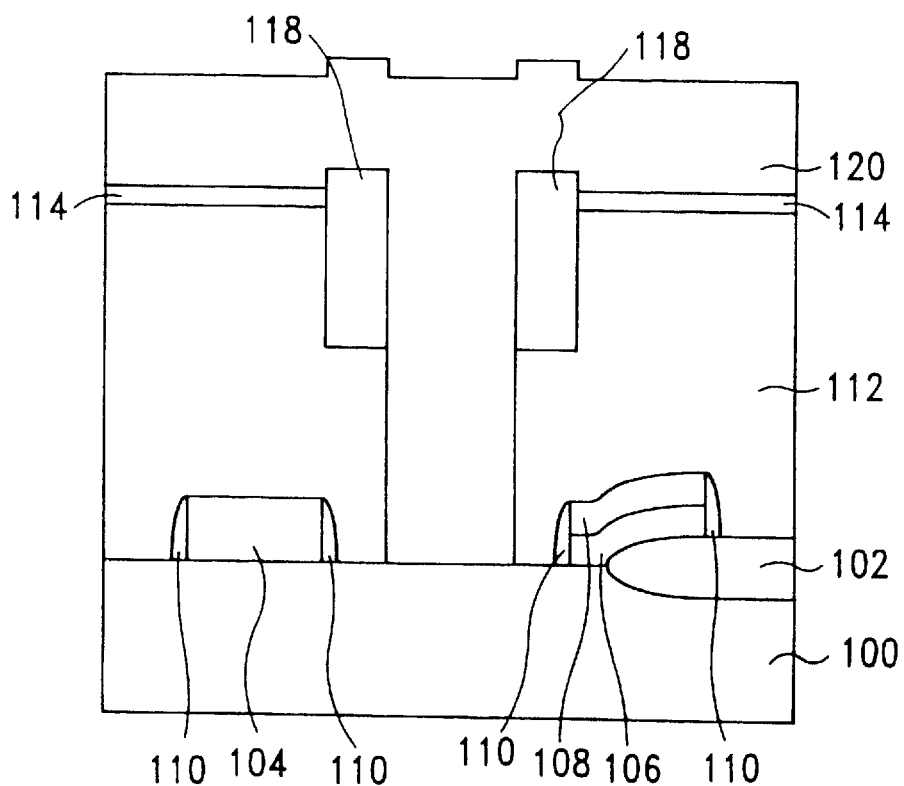

Referring to FIG. 6, a second polysilicon layer 120 is deposited to refill the first node contact in the silicon oxide layer 112, to cover the silicon nitride layer 114, and to cover the polysilicon layer 118. The polysilicon layer 120 forms a plug in the first contact hole 120.

Figure 7:
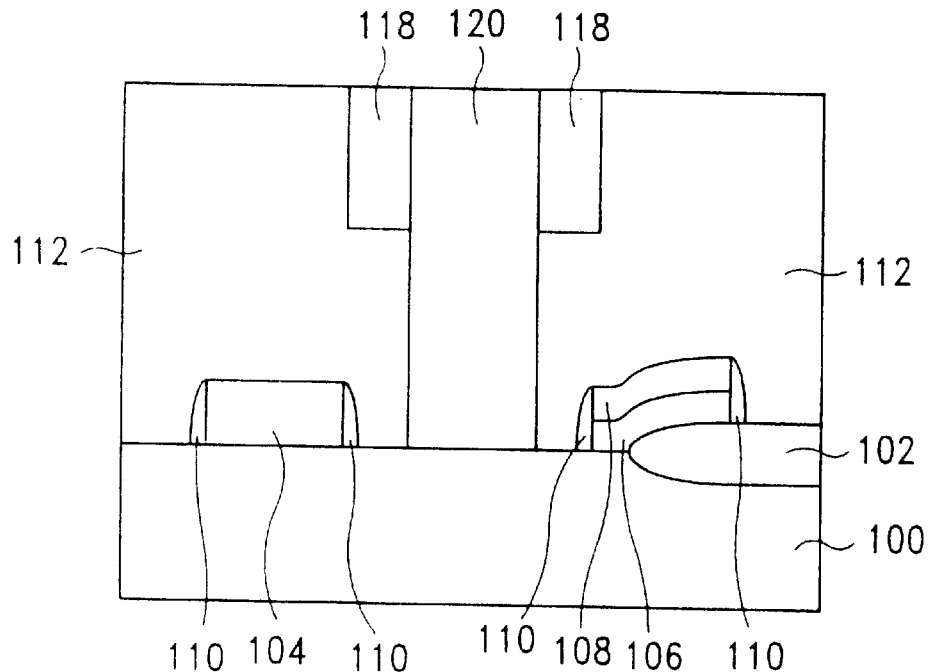

Referring to FIG. 7, a planarization process is performed to remove the silicon nitride layer 114, the upper portion of the polysilicon layer 120, and the upper portion of the polysilicon layer 118. In the preferred embodiment, the planarization process is a chemical mechanical polishing (CMP) process and it is a global planarization. Alternatively, the planarization process may be a dry etching process, such as a plasma etching process. After the planarization of the polysilicon layer 118, the polysilicon layer 120, and the silicon oxide layer 112, the polysilicon layer 120 forms a plug to refill the contact hole.

Figure 8:
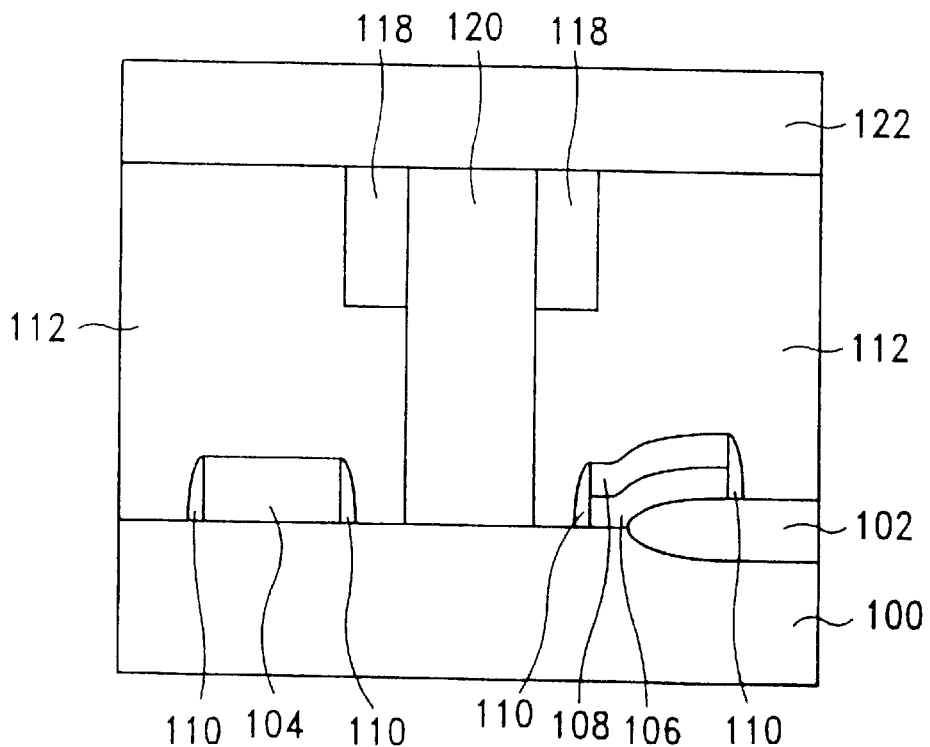

Referring to FIG. 8, a silicon oxide layer 122 is deposited onto the surface of the silicon oxide layer 112 and the polysilicon layers 118 and 120. The silicon oxide 122 is formed by using a conventional technique such as LPCVD, using tetraethylorthosilicate (TEOS) as a source, at a temperature of between about 600 to 800° C., and to a thickness of between about 1000 to 5000 angstroms.

Figure 9:
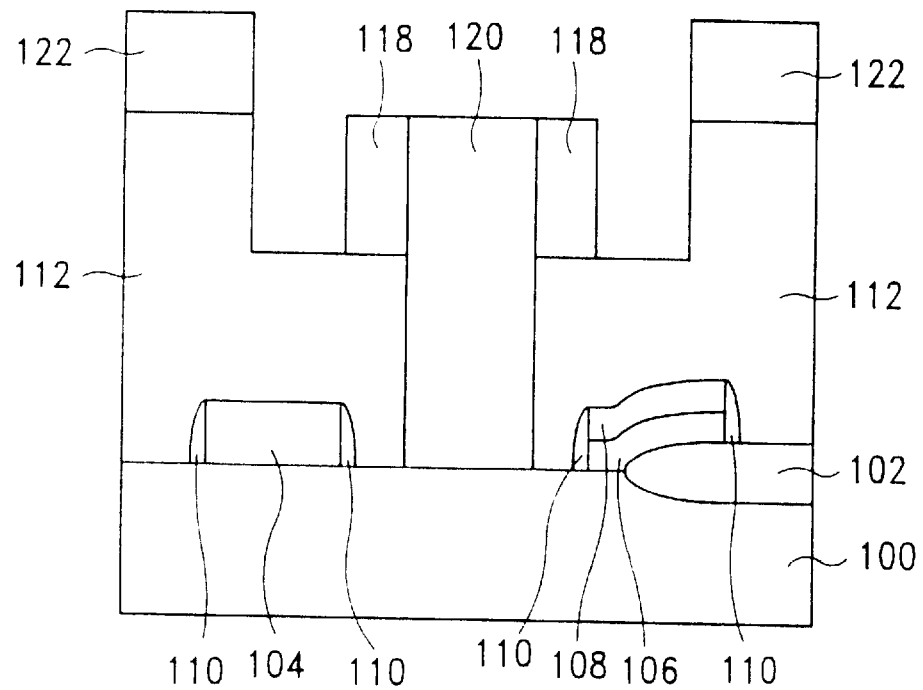

As be seen in FIG. 9, the silicon oxide layer 112 and the silicon oxide layer 122 is patterned and etched back to form a second node contact. In the second node contact, the polysilicon 120 is exposed and is not covered by the silicon oxide layer 112. The etching of the silicon oxide layer 112 and the silicon oxide layer 122 is an anisotropic etching. Note that the pattern for the second node contact is generally aligned to the first node contact, except that the second node contact is wider than the first node contact.

Figure 10:
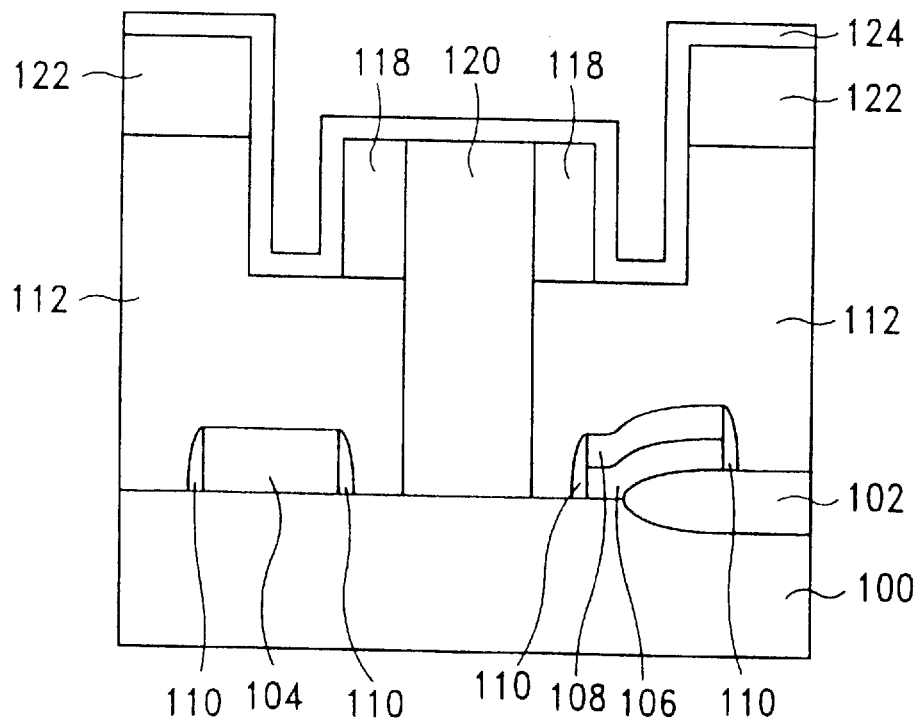

Next, turning to FIG. 10, a polysilicon with HSG structure layer 124 is deposited along the surface of the second node contact and the silicon oxide layer 122. The polysilicon layer with HSG structure 124 has a thickness of between about 300 to 1000 angstroms. The polysilicon with HSG structure layer 124 has a larger surface area than conventional polysilicon material. Thus, the formation of the HSG polysilicon in the polysilicon with HSG structure layer 124 can increase the surface of the bottom plate in the capacitor in order to increase the capacitance of the capacitor. Typically, the HSG polysilicon layer is deposited by using conventional chemical vapor deposition (CVD).

Figure 11:
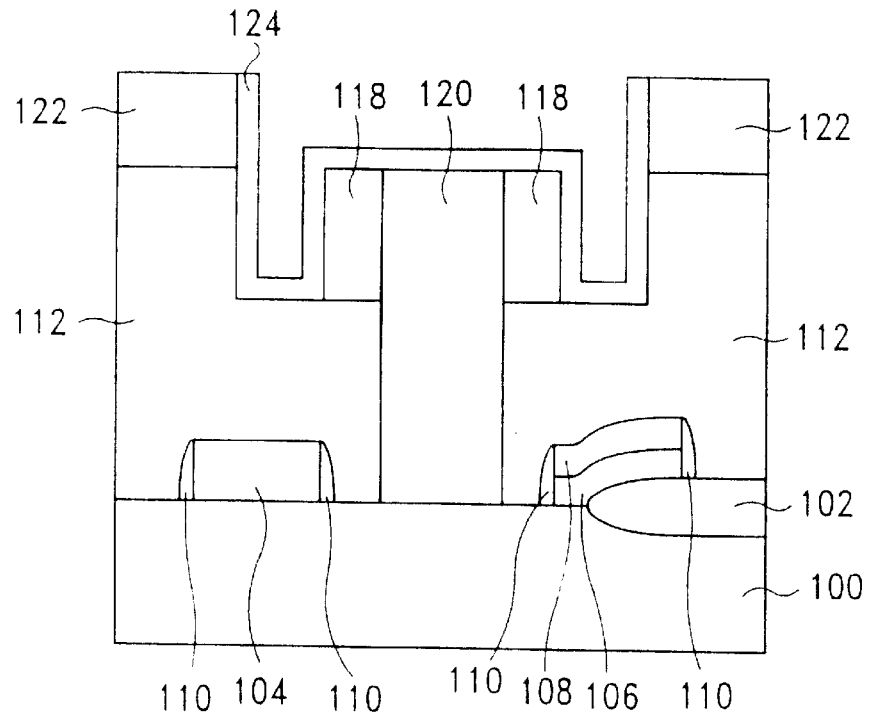

Turning next to FIG. 11, the polysilicon with HSG structure layer 124 is etched back to remove the polysilicon with HSG structure layer 124 on the silicon oxide layer 122. Alternatively, a CMP process may be used to remove the polysilicon with HSG structure layer 124 from the surface of the third silicon oxide layer 122.

Figure 12:
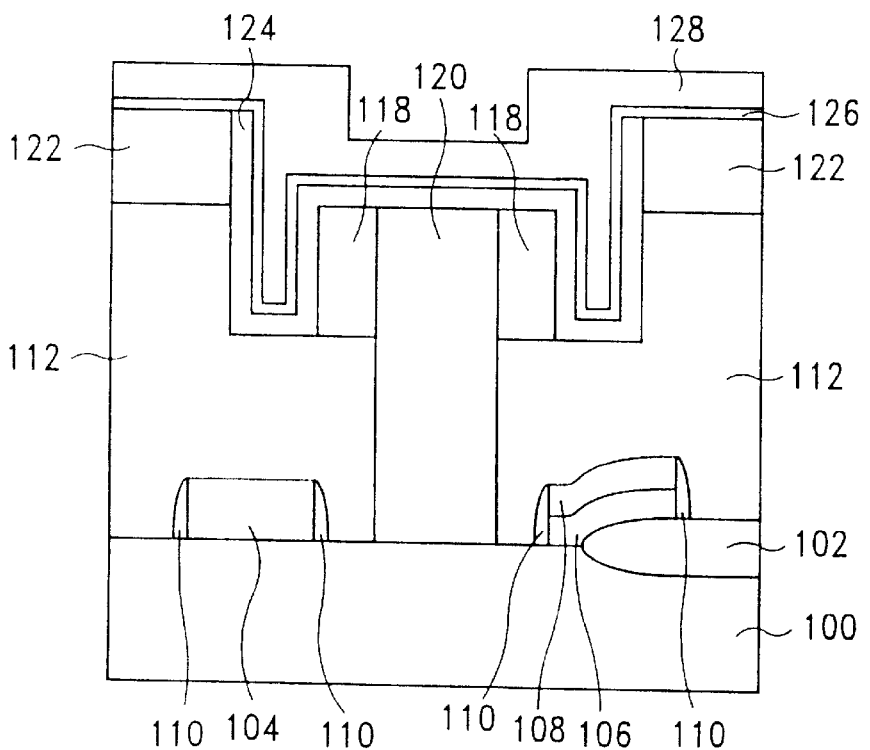

Turning to FIG. 12, a dielectric layer 126 is deposited along the surface area of the polysilicon layer with HSG structure 124 and the silicon oxide layer 122. Typically, the dielectric layer 126 is preferably formed of a double film of nitride/oxide film, a triple film of oxide/nitride/oxide, or any other high dielectric film such as tantalum oxide ($Ta_2O_5$), BST, PZT, PLZT. Finally, still referring to FIG. 12, a polysilicon layer 128 is deposited over the dielectric layer 126 for use as the top storage node. Preferably, the polysilicon layer 128 is formed of doped polysilicon or in-situ doped polysilicon.

The present invention disclosed the reverse crown structure as the capacitor and the reverse crown structure is covered in the node contact of the capacitor. Further, a reverse crown structure with hemispherical-grain polysilicon could increase the surface area of the capacitor. Therefore, the present invention increases the performance of the capacitor.

While the preferred embodiment of the invention has been illustrated and described, it will be appreciated that various changes can be made therein without departing from the spirit and scope of the invention.

What is claimed is:

1. A method to manufacture a reverse crown capacitor on a substrate, the method comprising the steps of:

forming a first dielectric layer onto said substrate;

forming an etching stop layer onto said first dielectric layer;

forming a second dielectric layer onto said etching stop layer;

patterning and etching said second dielectric layer, said etching stop layer and said first dielectric layer to form a first node contact;

forming a first conducting layer onto said second dielectric layer and into said first node contact;

etching back said first conducting layer to remove said first conducting layer and said second dielectric layer outside of said first node contact, further removing said first conducting layer at the bottom of said first node contact;

removing said second dielectric layer and said first dielectric layer under said first node contact using said first conducting layer as a hard mask to form a contact hole;

forming a second conducting layer to refill the contact hole and to cover said first conducting layer and said etching stop layer;

removing said etching stop layer and an upper portion of said first conducting layer and an upper portion of said second conducting layer;

forming a third dielectric layer onto said first dielectric layer, said first conducting layer, and said second conducting layer;

patterning and etching said third dielectric layer and said first dielectric layer to form a second node contact;

forming a third conducting layer into said second node contact and top said third dielectric layer;

removing said third conducting layer outside of said second node contact;

forming a dielectric film onto said third conducting layer; and forming a top plate onto said dielectric film.

2. The method of claim 1, wherein said first dielectric layer, said second dielectric layer and said third dielectric layer are formed of silicon oxide.

3. The method of claim 1, wherein said etching stop layer is formed of silicon nitride.

4. The method of claim 1, wherein the etching of said second dielectric layer, said etching stop layer and said first dielectric layer to form said first node contact region is done by a dry anisotropic etching.

5. The method of claim 1, wherein said first conducting layer, said second conducting layer and said third conducting layer arc formed from polysilicon material.

6. The method of claim 1, wherein the step of removing said etching stop layer, an upper portion of said first conducting layer and an upper portion of said second conducting layer is performed by a CMP process.

7. The method of claim 1, wherein the step of removing said etching stop layer, an upper portion of said first conducting layer and a upper portion of said second conducting layer is performed by a dry etching process.

8. The method of claim 1, wherein the etching of said third dielectric layer and said first dielectric layer to form a second node contact is performed using a buffer oxide etching (BOE) process or a dry etching process.

9. The method of claim 1, wherein said third conducting layer is formed of polysilicon or polysilic with hemispherical-grain (HSG) structure.

10. The method of claim 1, wherein said dielectric film is selected from the group consisting of nitride/oxide film, a triple film of oxide/nitride/oxide, tantalum oxide ($Ta_2O_5$), BST, PZT and PLZT.

11. A method of manufacturing a bottom storage node of a capacitor onto a substrate, the method comprising the steps of:

forming a first dielectric layer onto said substrate;

forming an etching stop layer onto said first dielectric layer;

forming a second dielectric layer onto said etching stop layer;

patterning and etching said second dielectric layer, said etching stop layer and said first dielectric layer to form a first node contact;

forming a first conducting layer onto said second dielectric layer and said first node contact;

etching back said first conducting layer to remove said first conducting layer on said second dielectric layer and on the bottom of said first node contact;

removing said second dielectric layer and said first dielectric layer below said first node contact to form a contact hole;

forming a second conducting layer to refill the contact hole and cover onto said first conducting layer and said etching stop layer;

removing said etching stop layer, an upper portion of said first conducting layer and an upper portion of said second conducting layer;

forming a third dielectric layer onto said first dielectric layer, said first conducting layer and said second conducting layer;

patterning and etching said third dielectric layer and said first dielectric layer to form a second node contact; and forming a third conducting layer onto said second node contact and said third dielectric layer.

12. The method of claim 11, wherein said first dielectric layer, said second dielectric layer and said third dielectric layer are formed of silicon oxide.

13. The method of claim 11, wherein said etching stop layer is formed of silicon nitride.

14. The method of claim 11, wherein the etching of said second dielectric layer, said etching stop layer and said first dielectric layer to form said first node contact region is performed using a dry anisotropic etching process.

15. The method of claim 11, wherein said first conducting layer and said second conducting layer are formed from polysilicon material.

16. The method of claim 11, wherein the step of removing said etching stop layer, an upper portion of said first conducting layer and an upper portion of said second conducting layer is performed using a CMP process.

17. The method of claim 11, wherein the step of removing said etching stop layer, an upper portion of said first conducting layer and an upper portion of said second conducting layer is performed via dry etching.

18. The method of claim 11, wherein the etching of said third dielectric layer and said first dielectric layer to form said second node contact is performed using a buffer oxide etching (BOE) solution or a dry etching process.

19. The method of claim 11, wherein said third conducting layer is formed of polysilicon or polysilicon with hemisphericalgrain (HSG) structure.

20. The method of claim 11, wherein said third conducting layer has a thickness of between about 300 to 1000 angstroms.

* * * * *

UNITED STATES PATENT AND TRADEMARK OFFICE
CERTIFICATE OF CORRECTION

PATENT NO. : 5,976,981
DATED : November 2, 1999
INVENTOR(S) : C.-H. Cheng

It is certified that error appears in the above-identified patent and that said Letters Patent is hereby corrected as shown below:

COLUMN  LINE 5          42         "arc" should read --are--
(Claim 5, line 3)

5          56         "polysilic" should read --polysilicon--
(Claim 9, line 2)

6          59         "sphericalgrain" should read --spherical-grain--
(Claim 19, line 3)

Signed and Sealed this

Third Day of April, 2001

Attest:

NICHOLAS P. GODICI

Attesting Officer          Acting Director of the United States Patent and Trademark Office